United States Patent
Takahashi

(10) Patent No.: US 11,716,034 B2
(45) Date of Patent: Aug. 1, 2023

(54) PIEZOELECTRIC DRIVE DEVICE, PIEZOELECTRIC MOTOR, AND ROBOT WITH THE PIEZOELECTRIC DRIVE DEVICE

(71) Applicant: SEIKO EPSON CORPORATION, Tokyo (JP)

(72) Inventor: Tomoaki Takahashi, Matsumoto (JP)

(73) Assignee: SEIKO EPSON CORPORATION, Tokyo (JP)

(*) Notice: Subject to any disclaimer, the term of this patent is extended or adjusted under 35 U.S.C. 154(b) by 132 days.

(21) Appl. No.: 17/198,255

(22) Filed: Mar. 11, 2021

(65) Prior Publication Data
US 2021/0288594 A1 Sep. 16, 2021

(30) Foreign Application Priority Data
Mar. 12, 2020 (JP) .................. 2020-042695

(51) Int. Cl.
*H02N 2/00* (2006.01)
*B25J 9/12* (2006.01)

(52) U.S. Cl.
CPC ............... *H02N 2/004* (2013.01); *B25J 9/12* (2013.01); *H02N 2/005* (2013.01)

(58) Field of Classification Search
CPC ...... H02N 2/004; H02N 2/005; H02N 2/0025; H02N 2/0065; H02N 2/103; H02N 2/10; H02N 2/12; H01L 41/312; H01L 41/318; B25J 9/12; B25J 17/0266
See application file for complete search history.

(56) References Cited

U.S. PATENT DOCUMENTS

| | | | | |
|---|---|---|---|---|
| 11,183,952 | B2* | 11/2021 | Lagorgette | H02N 2/0055 |
| 2005/0082947 | A1* | 4/2005 | Li | H02N 2/004 310/328 |
| 2017/0001306 | A1* | 1/2017 | Arakawa | H02N 2/004 310/328 |
| 2018/0034387 | A1 | 2/2018 | Arakawa et al. | |

FOREIGN PATENT DOCUMENTS

| | | |
|---|---|---|
| JP | H0617885 A | 1/1994 |
| JP | 2010233315 A | 10/2010 |
| JP | 2011155761 A | 8/2011 |
| JP | 2015006047 A | 1/2015 |
| JP | 2016039756 A | 3/2016 |
| JP | 2017059422 A | 3/2017 |
| JP | 2018019529 A | 2/2018 |
| WO | 2014203529 A1 | 12/2014 |

OTHER PUBLICATIONS

Search Report of the First Office Action CN Application No. 2021102555264 dated May 9, 2023.

* cited by examiner

*Primary Examiner* — Emily P Pham
(74) *Attorney, Agent, or Firm* — Gang Yu

(57) ABSTRACT

A piezoelectric drive device includes a piezoelectric element, a vibrating plate with a concave portion provided in a side surface, and a projecting portion provided between two side surfaces of the concave portion and having a spherical shape, an elliptical shape, or an egg shape, wherein a plurality of the piezoelectric elements and a plurality of the vibrating plates are stacked, and the concave portion includes a bottom surface.

8 Claims, 15 Drawing Sheets

PIEZOELECTRIC DRIVE DEVICE, PIEZOELECTRIC MOTOR, AND ROBOT WITH THE PIEZOELECTRIC DRIVE DEVICE

The present application is based on, and claims priority from JP Application Serial Number 2020-042695, filed Mar. 12, 2020, the disclosure of which is hereby incorporated by reference herein in its entirety.

BACKGROUND

1. Technical Field

The present disclosure relates to a piezoelectric drive device, a piezoelectric motor, and a robot.

2. Related Art

In ultrasonic motors, contact members are provided on ultrasonic vibrators and the contact members are brought into contact with driven members to drive the driven members. An ultrasonic motor disclosed in JP-A-2011-1155761 includes a pin base provided on an end of a vibrator as a contact member and a pin-shaped member provided on the pin base in friction contact with a driven member.

However, in the ultrasonic motor disclosed in JP-A-2011-1155761, the contact member may be dropped from the vibrator due to friction contact between the driven member and the contact member.

SUMMARY

According to one aspect of the present disclosure, a piezoelectric drive device is provided. The piezoelectric drive device includes a piezoelectric element, a vibrating plate with a concave portion provided in a side surface, and a projecting portion provided between two side surfaces of the concave portion and having a spherical shape, an elliptical shape, or an egg shape, wherein a plurality of the piezoelectric elements and a plurality of the vibrating plates are stacked, and the concave portion includes a bottom surface.

DESCRIPTION OF EXEMPLARY EMBODIMENTS

A. First Embodiment

Figure 1:
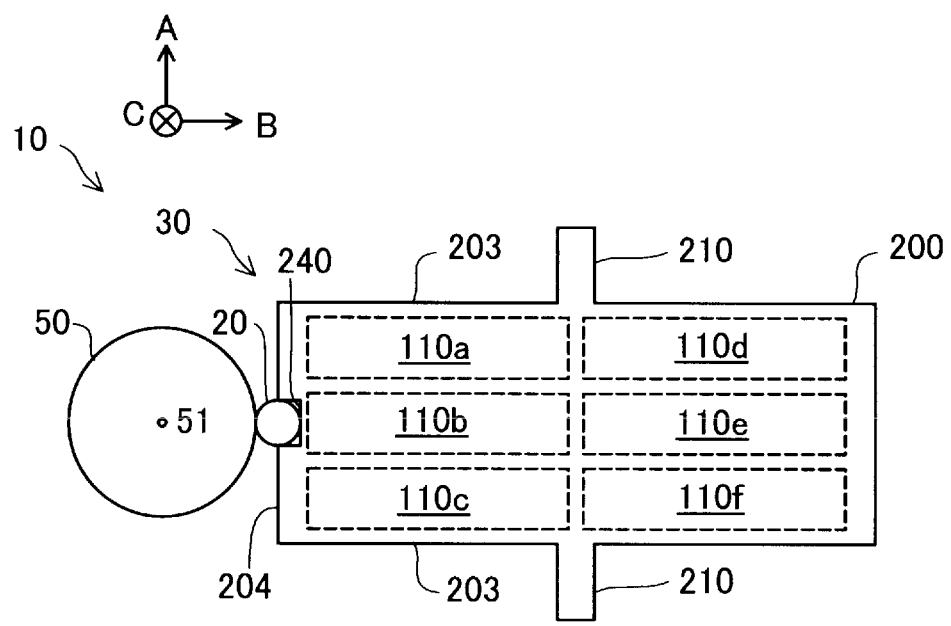
FIG. 1 is an explanatory diagram showing a schematic configuration of a piezoelectric motor.

FIG. 1 is an explanatory diagram showing a schematic configuration of a piezoelectric motor 10. The piezoelectric motor 10 includes a piezoelectric drive device 30 and a driven member 50. The piezoelectric drive device 30 includes a vibrating plate 200, six piezoelectric elements 110a, 110b, 110c, 110d, 110e, 110f and a projecting portion 20. The vibrating plate 200 has a substantially rectangular shape. The six piezoelectric elements 110a to 110f are arranged in a matrix form, specifically, in two rows along a long side 203 and three columns along a short side 204. Supporting portions 210 are provided at outsides of positions corresponding to between the two piezoelectric elements arranged in the longitudinal direction of the vibrating plate 200, specifically, between the piezoelectric elements 110a and 110d and between the piezoelectric elements 110c and 110f. When voltages are applied to the piezoelectric elements 110a to 110f at appropriate times, the vibrating plate 200 flexurally moves at nodes on the supporting portions 210.

The vibrating plate 200 has a recessed portion 240 substantially at the center of the short side 204 as one of side surfaces and the projecting portion 20 is provided in the recessed portion 240. In the embodiment, the projecting portion 20 has a spherical shape. Note that the projecting portion 20 may have another shape than the spherical shape e.g. an elliptical shape or an egg shape. Further, the projecting portion 20 may be integrated with the vibrating plate 200. When the vibrating plate 200 makes flexural motion, the projecting portion 20 presses the driven member 50 and drives the driven member 50. In the embodiment, the driven member 50 has a circular disc shape and the driven member 50 rotates around a center 51 thereof. Note that the driven member 50 may have a flat plate shape and be supported movable in an A direction. As shown in FIG. 1, in the vibrating plate 200, the direction in which the piezoelectric elements 110a, 110b, 110c are arranged is referred to as "A direction", the direction in which the piezoelectric elements 110a, 110d are arranged is referred to as "B direction", and the direction crossing the A direction and the B direction is referred to as "C direction".

Figure 2:
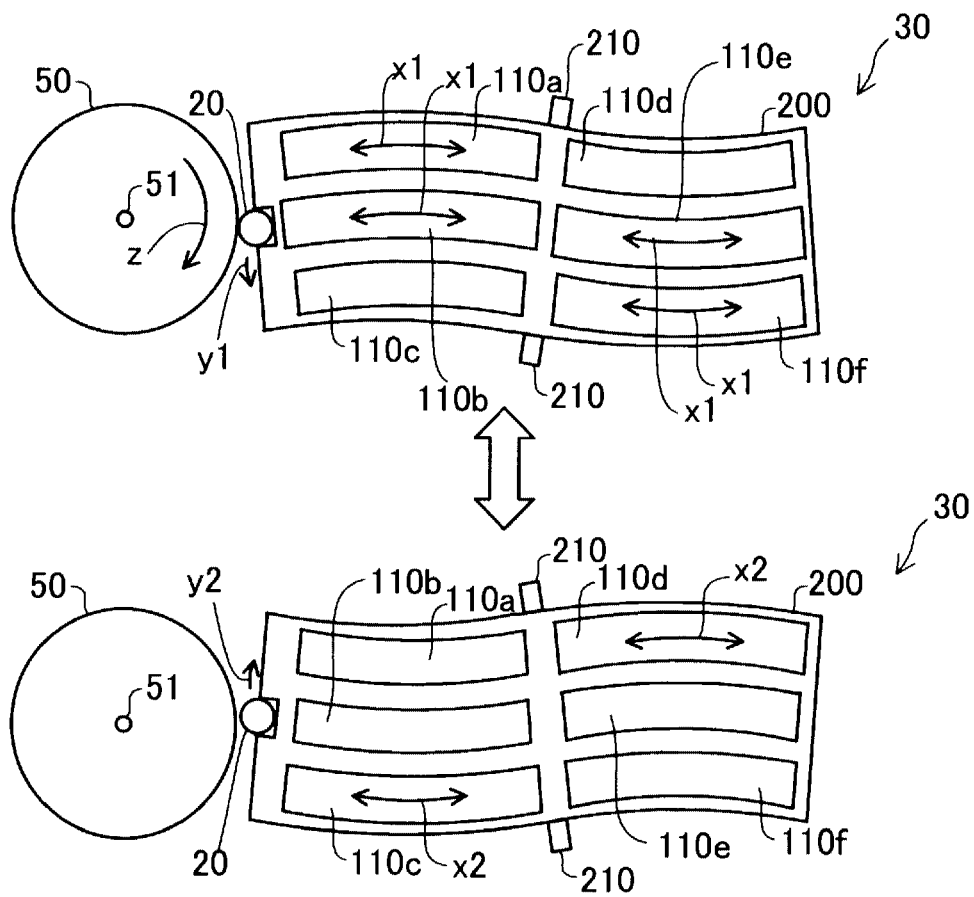
FIG. 2 is an explanatory diagram showing motion of the piezoelectric motor.

FIG. 2 is an explanatory diagram showing motion of the piezoelectric motor 10. A voltage is applied to the two piezoelectric elements diagonally placed in the vibrating plate 200, e.g. the piezoelectric element 110a and the piezoelectric element 110f. The piezoelectric element 110a and the piezoelectric element 110f extend as shown by arrows x1 and the vibrating plate 200 bends. The projecting portion 20 moves as shown by an arrow y1 by bending of the vibrating plate 200. Concurrently, a voltage is also applied to the piezoelectric element 110b and the piezoelectric element 110e at the center in the short side direction, and then, the piezoelectric element 110b and the piezoelectric element 110e also extend as shown by arrows x1 and the projecting portion 20 contacts and presses the driven member 50. As a result, the projecting portion 20 moves as shown by the arrow y1, and then, the driven member 50 rotates in a direction shown by an arrow z.

Then, a voltage is applied to the other two piezoelectric elements, the piezoelectric element 110c and the piezoelectric element 110d diagonally placed in the vibrating plate 200 and no voltage is applied to the other piezoelectric element 110a, piezoelectric element 110b, piezoelectric element 110e, and piezoelectric element 110f. The piezoelectric element 110c and the piezoelectric element 110d extend as shown by arrows x2, the vibrating plate 200 bend in the opposite direction, and the projecting portion 20 moves as shown by an arrow y2. However, no voltage is applied to the piezoelectric element 110b and the piezoelectric element 110e at the center in a lateral direction, and the projecting portion 20 is apart from the driven member 50 and does not press the member. As a result, even when the projecting portion 20 moves as shown by the arrow y2, the driven member 50 does not rotate. The voltage application to the piezoelectric elements is repeated, and thereby, the driven member 50 may be rotated in the direction shown by the arrow z. Note that, when the driven member 50 is rotated in the opposite direction to the z direction, when the voltage is applied to the piezoelectric element 110a and the piezoelectric element 110f, no voltage may be applied to the piezoelectric element 110b and the piezoelectric element 110e and, when the voltage is applied to the piezoelectric element 110c and the piezoelectric element 110d, the voltage may be applied to the piezoelectric element 110b and the piezoelectric element 110e.

Figure 3:
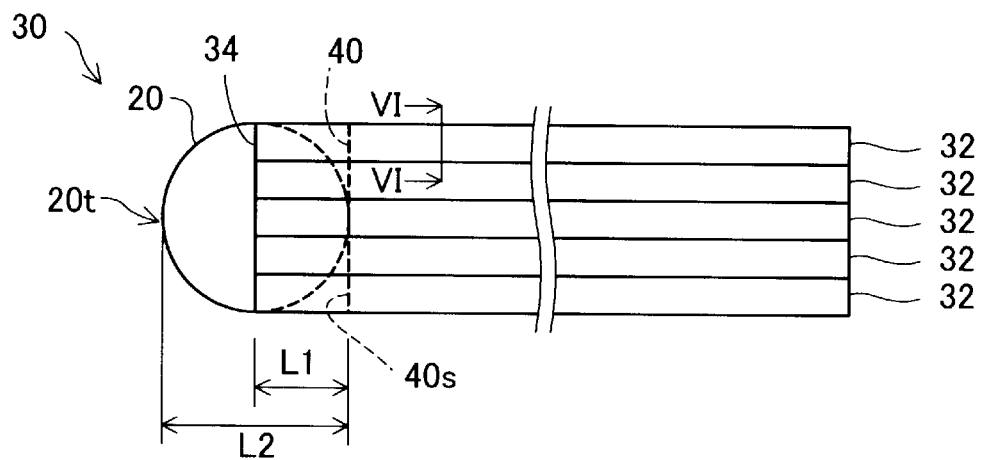
FIG. 3 shows a piezoelectric drive device as seen in a direction of an arrow A.

FIG. 3 shows the piezoelectric drive device 30 as seen from the supporting portion 210 side, i.e., in a direction of an arrow A. The piezoelectric drive device 30 of the first embodiment includes a plurality of stacked units 32. The configuration of the unit 32 will be described later. In the example shown in FIG. 3, the piezoelectric drive device 30 includes the five units 32. Each unit 32 has a concave portion 40 and the five concave portions 40 collectively form the recessed portion 240 shown in FIG. 1. A depth of the recessed portion 240, i.e., a depth L1 from bottom surfaces 40s of the concave portions 40 to a short side 34 is shallower than a length L2 from the bottom surfaces 40s of the concave portions 40 to a top part 20t of the projecting portion 20 and equal to or more than L2/2. The depth of the recessed portion 240 may be equal to or less than L2/2. The amount of projection of the projecting portion 20 may be made larger. Note that it is preferable that the depth of the recessed portion 240 is equal to or more than L2/4.

Figure 4:
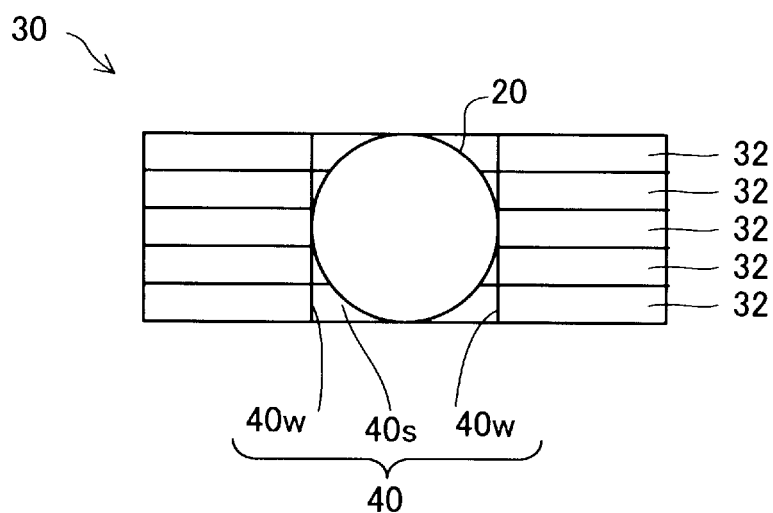
FIG. 4 shows the piezoelectric drive device as seen in a direction of an arrow B.
Figure 5:
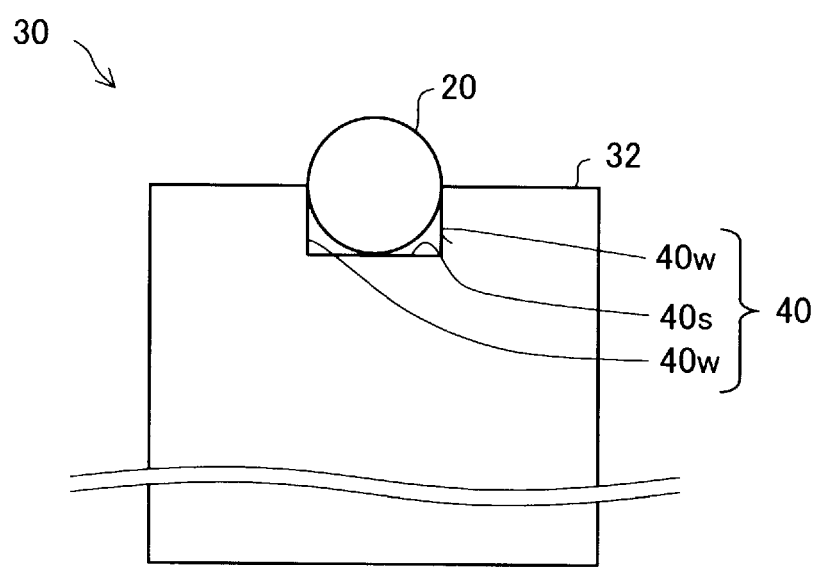
FIG. 5 shows the piezoelectric drive device as seen in a direction of an arrow C.

FIG. 4 shows the piezoelectric drive device 30 as seen from the projecting portion 20 side, i.e., in a direction of an arrow B. FIG. 5 shows the piezoelectric drive device as seen from a stacking direction of the units, i.e., in a direction of an arrow C. The concave portion 40 includes the bottom surface 40s and two side surfaces 40w facing each other. In the first embodiment, the concave portions 40 have the same shape in the five units 32. Accordingly, the concave portions 40 form the rectangular parallelepiped recessed portion 240 (FIG. 1). The projecting portion 20 is placed in the recessed portion 240. From the motion of the vibrating plate 200 shown in FIG. 2, a force in a direction orthogonal to the side surfaces 40w is applied to the projecting portion 20, however, no force is applied thereto in the stacking direction of the units 32.

Figure 6:
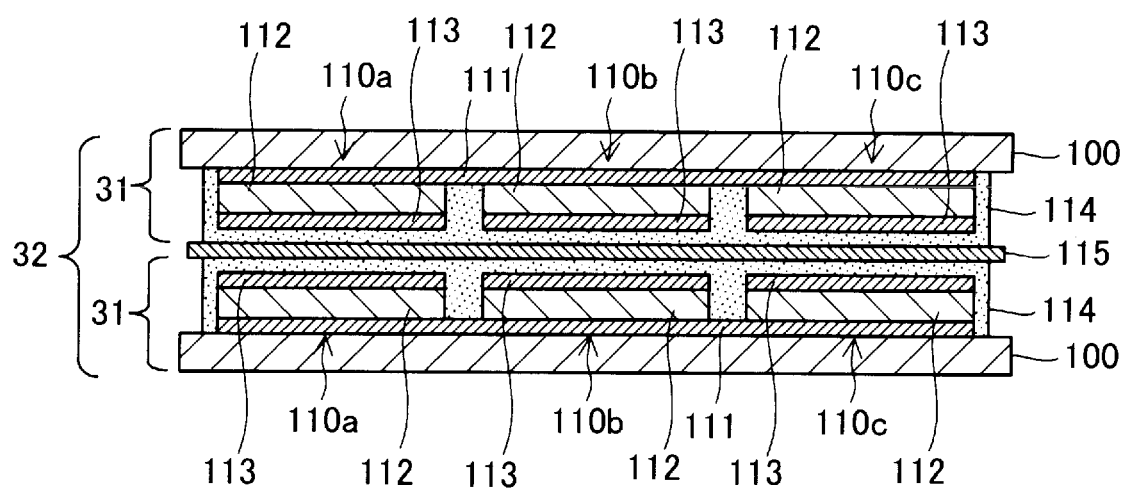
FIG. 6 is a sectional view along VI-VI in FIG. 3.

FIG. 6 is a sectional view along VI-VI in FIG. 3, i.e., a section of the unit 32. The unit 32 includes two piezoelectric vibrators 31. The piezoelectric vibrator 31 includes the six piezoelectric elements of the piezoelectric element 110a to the piezoelectric element 110f, however, only the three piezoelectric element 110a, piezoelectric element 110b, piezoelectric element 110c are seen because FIG. 6 is the sectional view along VI-VI in FIG. 3. The piezoelectric element 110a to the piezoelectric element 110f are respectively formed on a substrate 100 that functions as a vibrating plate. The piezoelectric element 110a to the piezoelectric element 110f include a first electrode 111, piezoelectric materials 112, and second electrodes 113 from the substrate 100 side. The first electrode 111 is a common electrode among the respective piezoelectric elements 110a to 110f, and the piezoelectric materials 112 and the second electrodes 113 are independent of one another among the respective piezoelectric elements 110a to 110f. Note that the first electrode 111 may be provided independently of one another among the respective piezoelectric elements 110a to 110f.

An insulating film 114 is formed on the piezoelectric elements 110a to 110f. The unit 32 is formed by bonding of the two piezoelectric vibrators 31 using an adhesive 115 with the piezoelectric elements 110a to 110f facing inside and the vibrating plate 200 facing the outside.

Figure 7:
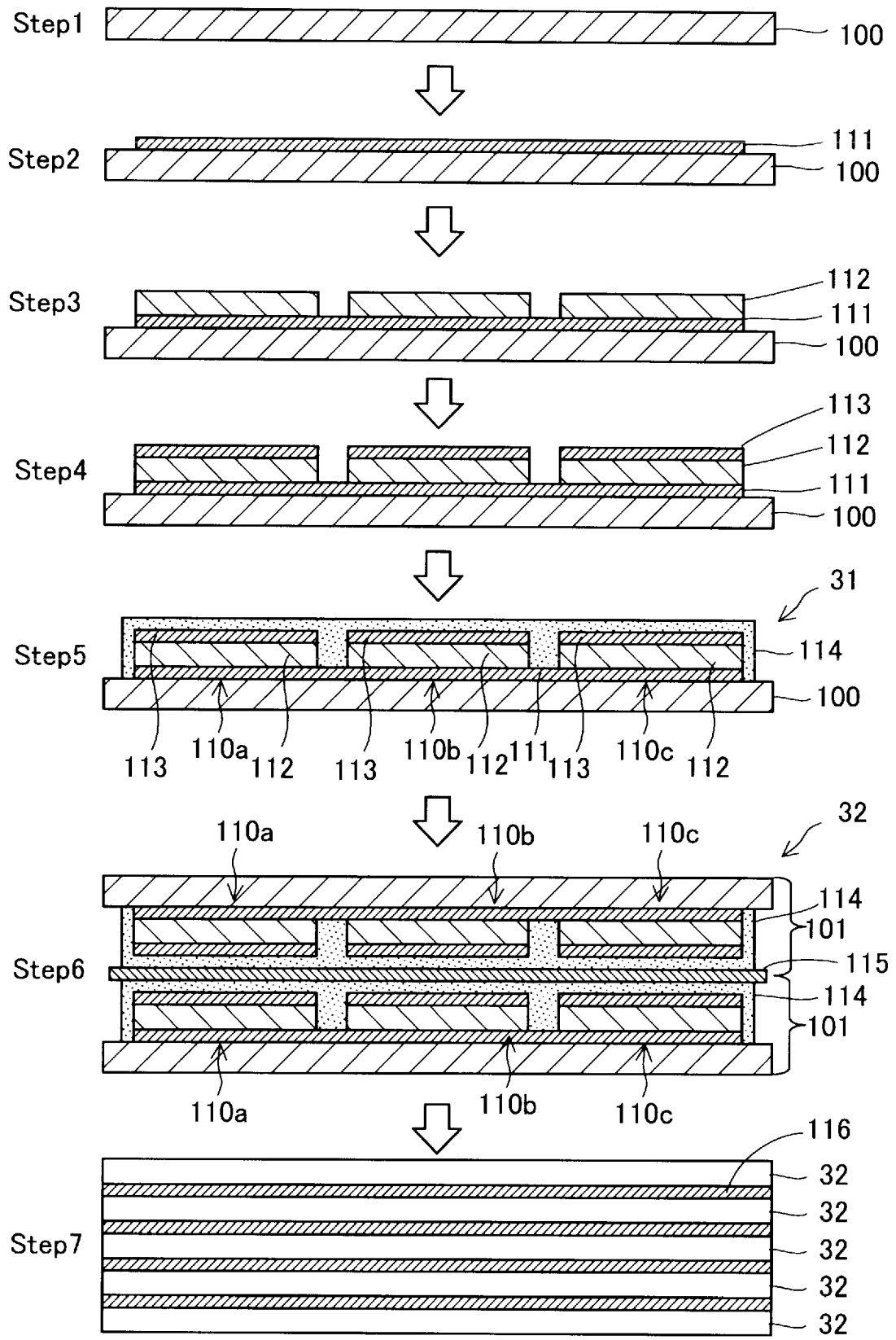
FIG. 7 is an explanatory diagram showing a manufacturing process of the piezoelectric drive device.

FIG. 7 is an explanatory diagram showing a manufacturing process of the piezoelectric drive device 30. At Step 1, the substrate 100 is prepared as the vibrating plate. The substrate 100 is e.g. a silicon wafer. At Step 2, the first electrode 111 is formed on the substrate 100 and patterned. The formation of the first electrode 111 may be performed by sputtering and the patterning may be performed by etching. Note that, before the formation of the first electrode 111, an insulating film of silicon oxide may be formed by oxidation of silicon.

At Step 3, the piezoelectric material 112 is formed on the first electrode 111 and patterned. The formation of the piezoelectric material 112 can be performed using e.g. the sol-gel method. That is, a sol-gel solution of a piezoelectric material is dropped on the vibrating plate 200 (first electrode 111), the vibrating plate 200 is rotated at a high speed, and thereby, a thin film of the sol-gel solution is formed on the first electrode 111. Then, the thin film is preliminarily fired at a temperature from 200 to 300° C. and a first layer of the piezoelectric material is formed on the first electrode 111. Then, a cycle of dropping of the so-gel solution, high-speed rotation, and preliminary sintering is repeated at a plurality of times, and thereby, the piezoelectric material layer is formed to a desired thickness on the first electrode 111. After the piezoelectric material layer is formed to the desired thickness, the layer is sintered at a temperature from 600° C. to 1000° C., and thereby, the piezoelectric material 112 is formed.

Then, the piezoelectric material 112 is patterned by ion milling using an argon ion beam. In place of patterning using ion milling, patterning may be performed using any other patterning method (e.g. dry etching using a chlorine-based gas).

At Step 4, the second electrode 113 is formed on the piezoelectric materials 112 and patterned. The formation and the patterning of the second electrode 113 may be performed by sputtering and etching like those of the first electrode 111.

At Step 5, the insulating film 114 is formed on the second electrodes 113. Thereby, the piezoelectric vibrator 31 is formed. When the piezoelectric vibrator 31 is manufactured using the silicon wafer, many piezoelectric vibrators 31 can be manufactured from the single silicon wafer and are separated into individual piezoelectric vibrators 31 using e.g. laser. At the same time, the concave portions 40 are formed. In the respective embodiments, which will be described later, shapes and positions of the concave portions are different.

At Step 6, the two piezoelectric vibrators 31 are bonded using the adhesive 115 with the piezoelectric elements 110a to 110f facing inside and the vibrating plate 200 facing outside, and thereby, the unit 32 is formed.

At Step 7, a plurality of the units 32 are stacked in the direction in which the piezoelectric elements 110a to 110f and the substrates 100 are arranged and bonded by adhesives 116. Then, the projecting portion 20 is placed in the recessed portion 240 (FIG. 1) and bonded. In the respective embodiments to be described later, the projecting portion 20 is bonded in the recessed portion.

According to the first embodiment, the piezoelectric drive device 30 includes the recessed portion 240, i.e., the concave portions 40 of the units 32 in the short side 204 of the vibrating plate 200. The concave portion 40 has the bottom surface 40s and the two side surfaces 40w facing each other and the projecting portion 20 is placed in the concave portions 40. As a result, even when a force in a direction orthogonal to the side surfaces 40w is applied to the projecting portion 20, the side surfaces 40w suppress dropping of the projecting portion 20.

Further, according to the first embodiment, the depth L1 of the concave portions 40 is shallower than the length L2 from a lower part of the projecting portion 20 in contact with the bottom surfaces 40s of the concave portions 40 to the top part 20t at the opposite side to the lower part and equal to or more than L2/2, that is, equal to or more than a half of a length from the bottom surfaces 40s to the top part 20t, i.e., the height L2 of the projecting portion 20. As a result, a half or more of the projecting portion 20 is inserted into the concave portions 40, and thereby, dropping of the projecting portion 20 may be further suppressed. Note that the depth L1 of the concave portions 40 is not necessarily equal to or more than L2/2. As described above, the projecting portion 20 is bonded to the recessed portion 240. In this specification, the lower part of the projecting portion 20 contacting the bottom surfaces 40s of the concave portions 40 includes contact between the projecting portion 20 and the recessed portion 240 via an adhesive.

B. Second Embodiment

Figure 8:
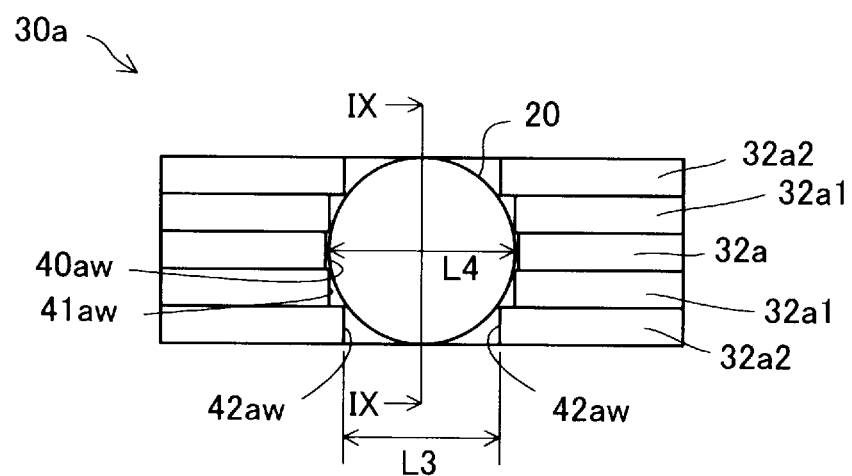
FIG. 8 shows a piezoelectric drive device of a second embodiment as seen in the direction of the arrow B.

A piezoelectric drive device 30a of a second embodiment is different from the piezoelectric drive device 30 of the first embodiment only in shapes of concave portions 40a, 41a, 42a, and the rest of the configuration is the same. The concave portion 40a has a bottom surface 40as and side surfaces 40aw, the concave portion 41a has a bottom surface 41as and side surfaces 41aw, and the concave portion 42a has a bottom surface 42as and side surfaces 42aw. FIG. 8 shows the piezoelectric drive device 30a of the second embodiment as seen in the direction of the arrow B, i.e., from the projecting portion side. In the second embodiment, as shown in FIG. 8, a distance between the two side surfaces 41aw of a unit 32a1 at the outside in the stacking direction is smaller and a distance L3 between the two side surfaces 42aw of a unit 32a2 at the outer side in the stacking direction is even smaller than a distance between the two side surfaces 40aw of a unit 32a at the center in the stacking direction. Further, the distance L3 is smaller than a diameter L4 of the projecting portion 20 in a direction parallel to a plane formed by the unit 32a.

Figure 9:
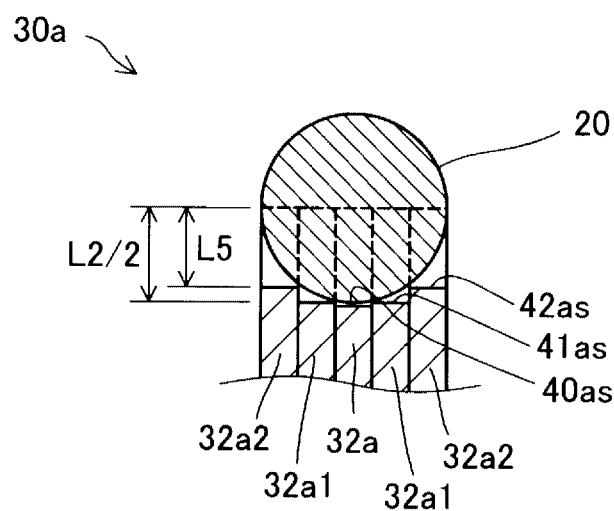
FIG. 9 is a sectional view along IX-IX in FIG. 8.

FIG. 9 is a sectional view along IX-IX in FIG. 8. In the second embodiment, as shown in FIG. 9, a depth to the bottom surface 41as of the unit 32a1 at the outside in the stacking direction is shallower and a depth L5 to the bottom surface 42as of the unit 32a2 at the outer side in the stacking direction is even shallower than a depth to the bottom surface 40as of the unit 32a at the center in the stacking direction. Further, the depth L5 is shallower than a half of the height L2 of the projecting portion 20.

Figure 10:
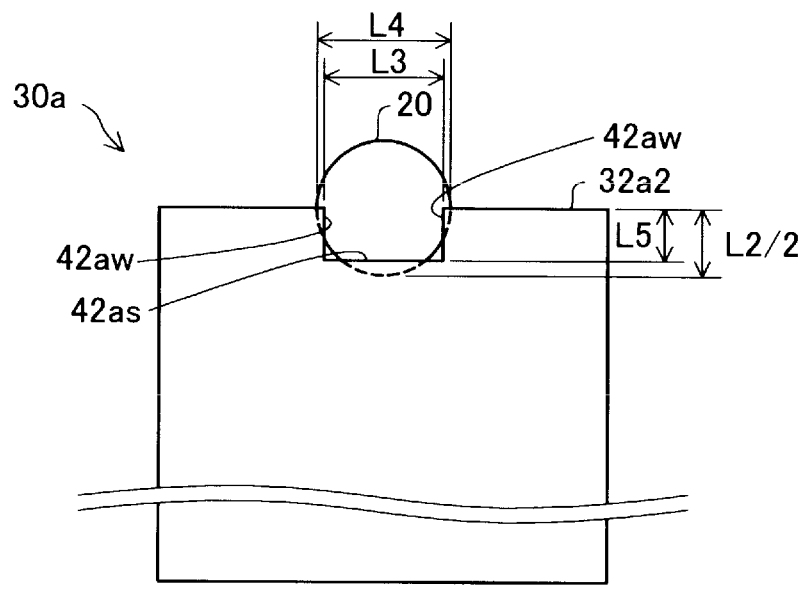
FIG. 10 shows the piezoelectric drive device of the second embodiment as seen in the direction of the arrow C.

FIG. 10 shows the piezoelectric drive device 30a of the second embodiment as seen in the direction of the arrow C, i.e., from the stacking direction of the unit 32a, the units 32a1, and the units 32a2. As described in FIG. 8, the distance L3 of the unit 32a2 is smaller than the diameter L4 and, as described in FIG. 9, the depth L5 to the bottom surface 42as of the unit 32a2 is smaller than the half of the height L2 of the projecting portion 20. Accordingly, when the piezoelectric drive device 30a is seen from the stacking direction of the unit 32a, the units 32a1, and the units 32a2, the two side surfaces 42aw and the bottom surface 42as of the concave portion of the unit 32a2 hide a part of the projecting portion 20. As a result, even when a force in a direction orthogonal to the side surfaces 40aw is applied to the projecting portion 20, the side surfaces 40aw suppress dropping of the projecting portion 20. Further, even when a force in the stacking direction of the unit 32a, the units 32a1, and the units 32a2 to the projecting portion 20, the side surfaces 42aw and the bottom surfaces 42as suppress dropping of the projecting portion 20.

Note that, in the second embodiment, only one of the configurations explained in FIGS. 8 and 9 may be provided. In the configuration shown in FIG. 8, the side surfaces 42aw suppress dropping of the projecting portion 20 and, in the configuration shown in FIG. 9, the bottom surfaces 42as suppress dropping of the projecting portion 20. The configuration described in FIG. 9 can be employed in the other embodiments to be described later.

C. Third Embodiment

Figure 11:
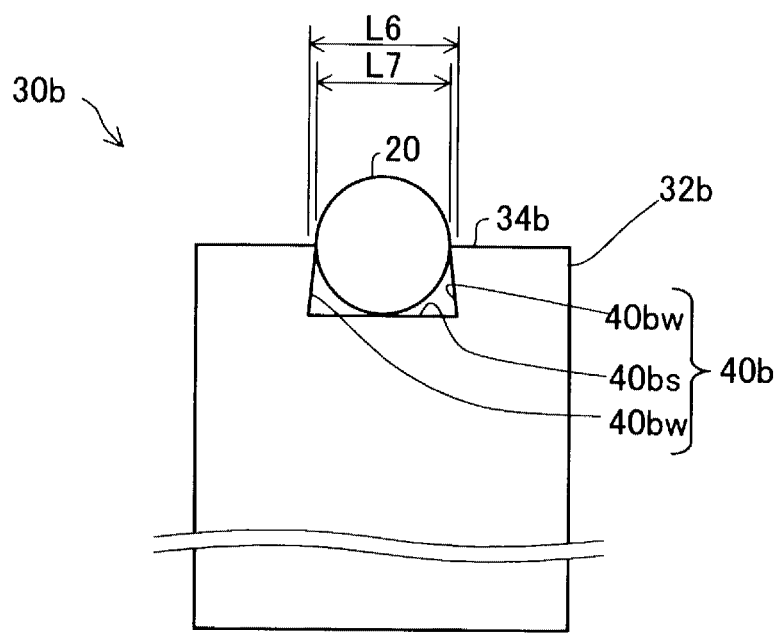
FIG. 11 shows a piezoelectric drive device of a third embodiment as seen in the direction of the arrow C.

FIG. 11 shows a piezoelectric drive device 30b of a third embodiment as seen in the direction of the arrow C, i.e., from the stacking direction of units. The piezoelectric drive device 30b of the third embodiment is different from the piezoelectric drive device 30 of the first embodiment in a shape of a concave portion 40b. Specifically, a distance L6 between two side surfaces 40bw at a bottom surface 40bs side is larger than a distance L7 between two side surfaces 40bw at the opposite side to the bottom surface 40bs, i.e., a short side 34b side.

According to the piezoelectric drive device 30b of the third embodiment, even when a force in a direction orthogonal to the side surfaces 40bw is applied, the distance L6 between the two side surfaces 40bw at the bottom surface 40bs side is larger than the distance L7 between the two side surfaces 40bw at the opposite side to the bottom surface 40bs, i.e., the short side 34b side, and thus, angles formed by the side surfaces 40bw and the short side 34b are acute angles and the projecting portion 20 may be harder to climb the side surfaces 40bw. As a result, dropping of the projecting portion 20 may be suppressed.

D. Fourth Embodiment

Figure 12:
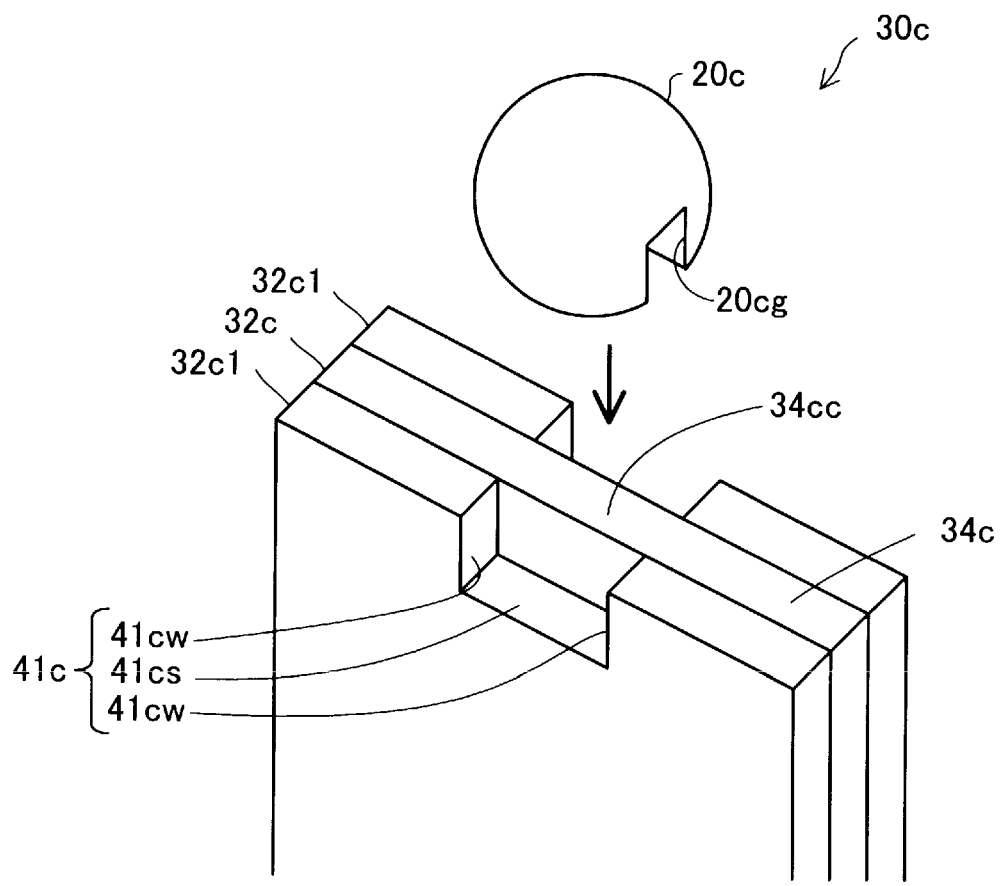
FIG. 12 is a perspective view of a piezoelectric drive device of a fourth embodiment.
Figure 13:
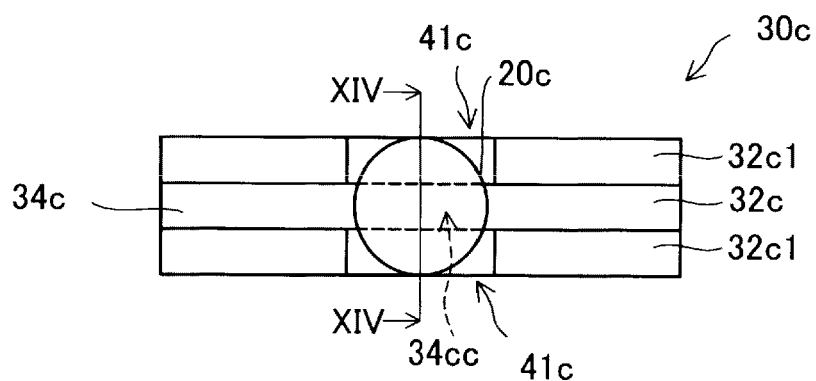
FIG. 13 shows the piezoelectric drive device of the fourth embodiment as seen in the direction of the arrow B.
Figure 14:
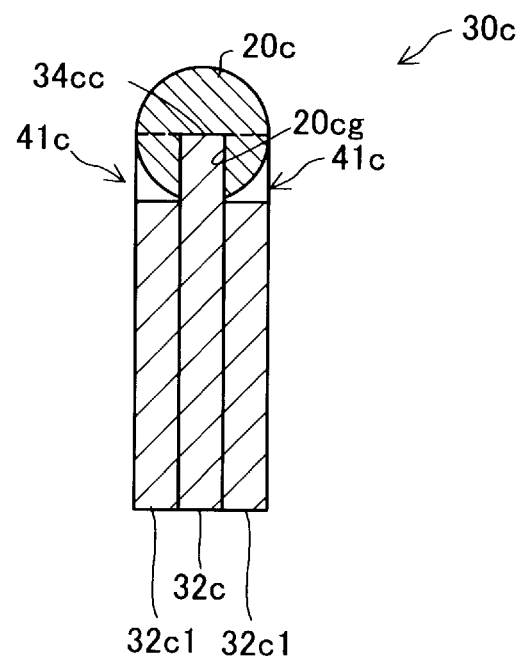
FIG. 14 is an explanatory diagram showing a section along XIV-XIV in FIG. 13.
Figure 15:
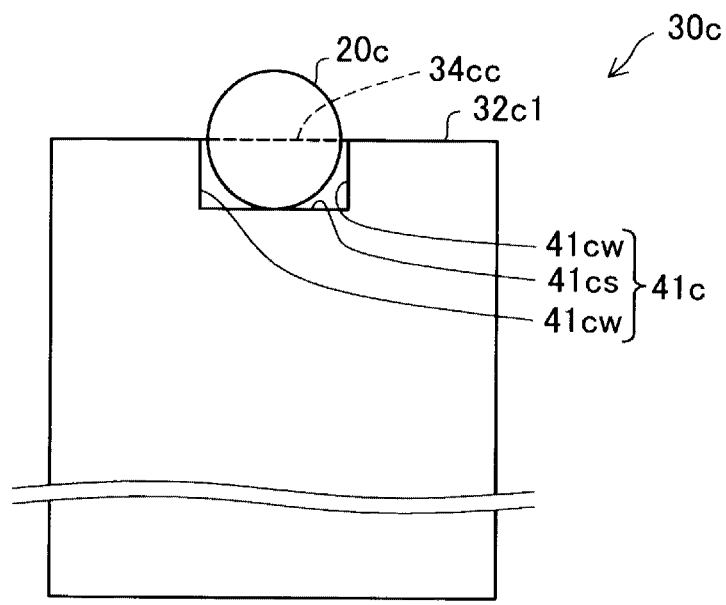
FIG. 15 shows the piezoelectric drive device of the fourth embodiment as seen in the direction of the arrow C.

FIG. 12 is a perspective view of a piezoelectric drive device 30c of a fourth embodiment. FIG. 13 shows the piezoelectric drive device 30c of the fourth embodiment as seen in the direction of the arrow B, i.e., from a projecting portion 20c side. FIG. 14 is an explanatory diagram showing a section along XIV-XIV in FIG. 13. FIG. 15 shows the piezoelectric drive device 30c of the fourth embodiment as seen in the direction of the arrow C, i.e., from a stacking direction of units 32c, 32c1.

In the piezoelectric drive device 30c of the fourth embodiment, no concave portion is provided in the unit 32c at the center, and concave portions 41c are provided in the units 32c1 at the outsides in the stacking direction in comparison to the piezoelectric drive device 30 of the first embodiment. The concave portion 41c includes a bottom surface 41cs and side surfaces 41cw. A center portion 34cc of a short side 34c of the center unit 32c is sandwiched by the two concave portions 41c and relatively has a convex shape. The projecting portion 20c includes a groove 20cg. The center portion 34cc of the center unit 32c is inserted into the groove 20cg of the projecting portion 20c.

According to the fourth embodiment, even when a force in a direction orthogonal to the side surfaces 41cw is applied to the projecting portion 20, the side surfaces 41cw suppress dropping of the projecting portion 20c. Further, the center portion 34cc of the center unit 32c is inserted into the groove 20cg of the projecting portion 20c and, even when a force in the stacking direction of the units 32c, 32c1 is applied to the projecting portion 20c, the center portion 34cc may suppress dropping of the projecting portion 20c in the stacking direction. Furthermore, the contact area between the projecting portion 20c and the center portion 34cc of the center unit 32c is larger, and thus, the bonding force may be made stronger and dropping of the projecting portion 20c may be suppressed with respect to any direction.

E. Fifth Embodiment

Figure 16:
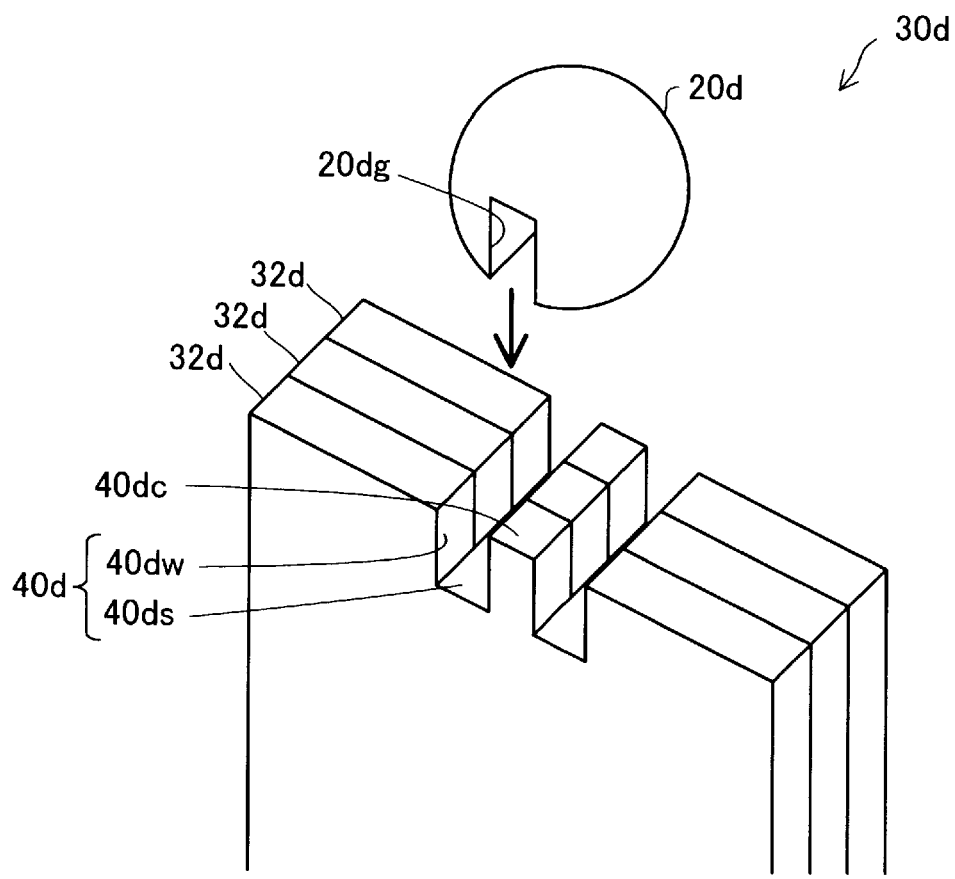
FIG. 16 is a perspective view of a piezoelectric drive device of a fifth embodiment.
Figure 17:
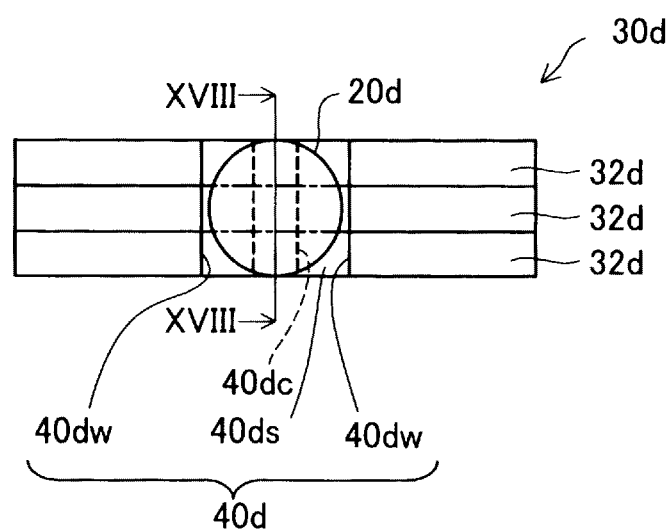
FIG. 17 shows the piezoelectric drive device of the fifth embodiment as seen in the direction of the arrow B.
Figure 18:
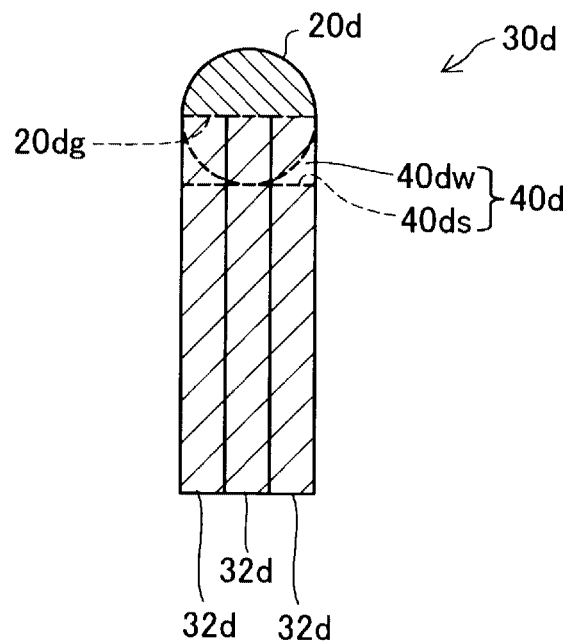
FIG. 18 is an explanatory diagram showing a section along XVIII-XVIII in FIG. 17.
Figure 19:
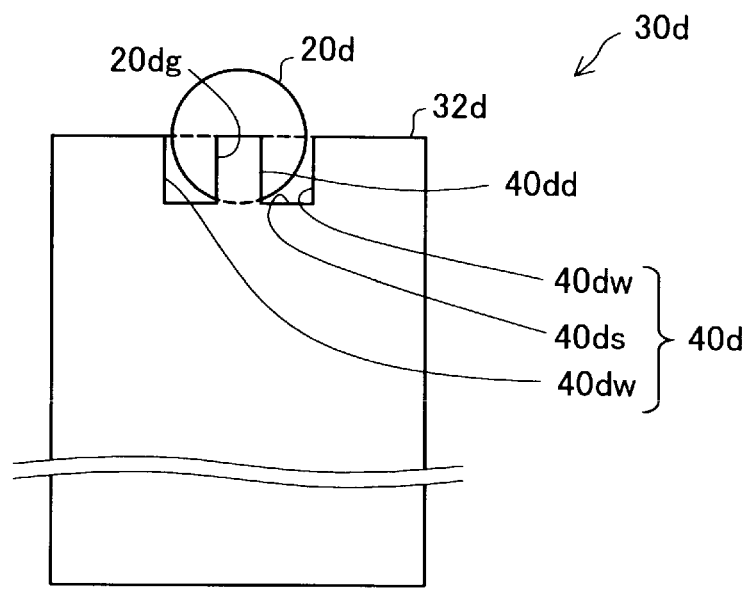
FIG. 19 shows the piezoelectric drive device of the fifth embodiment as seen in the direction of the arrow C.

FIG. 16 is a perspective view of a piezoelectric drive device 30d of a fifth embodiment. FIG. 17 shows the piezoelectric drive device 30d of the fifth embodiment as seen in the direction of the arrow B, i.e., from a projecting portion 20d side. FIG. 18 is an explanatory diagram showing a section along XVIII-XVIII in FIG. 17. FIG. 19 shows the piezoelectric drive device 30d of the fifth embodiment as seen in the direction of the arrow C, i.e., from a stacking direction of units 32d.

The piezoelectric drive device 30d of the fifth embodiment is different from the piezoelectric drive device 30 of the first embodiment in that convex portions 40dc projecting from bottom surfaces 40ds are provided at the center of two side surfaces 40dw of concave portions 40d. The convex portion 40dc divides the concave portion 40d into two. The projecting portion 20d includes a groove 20dg. The convex portions 40dc are inserted into the groove 20dg of the projecting portion 20d.

According to the fifth embodiment, the convex portions 40dc of the units 32d are inserted into the groove 20dg of the projecting portion 20d, and thus, even when a force in a direction orthogonal to the side surfaces 40dw is applied to the projecting portion 20d, dropping of the projecting portion 20d may be suppressed by the side surfaces 40dw and the convex portions 40dc. Furthermore, the contact area between the projecting portion 20d and the convex portions 40dc is larger, and thus, the bonding force may be made stronger and dropping of the projecting portion 20d may be suppressed.

F. Sixth Embodiment

Figure 20:
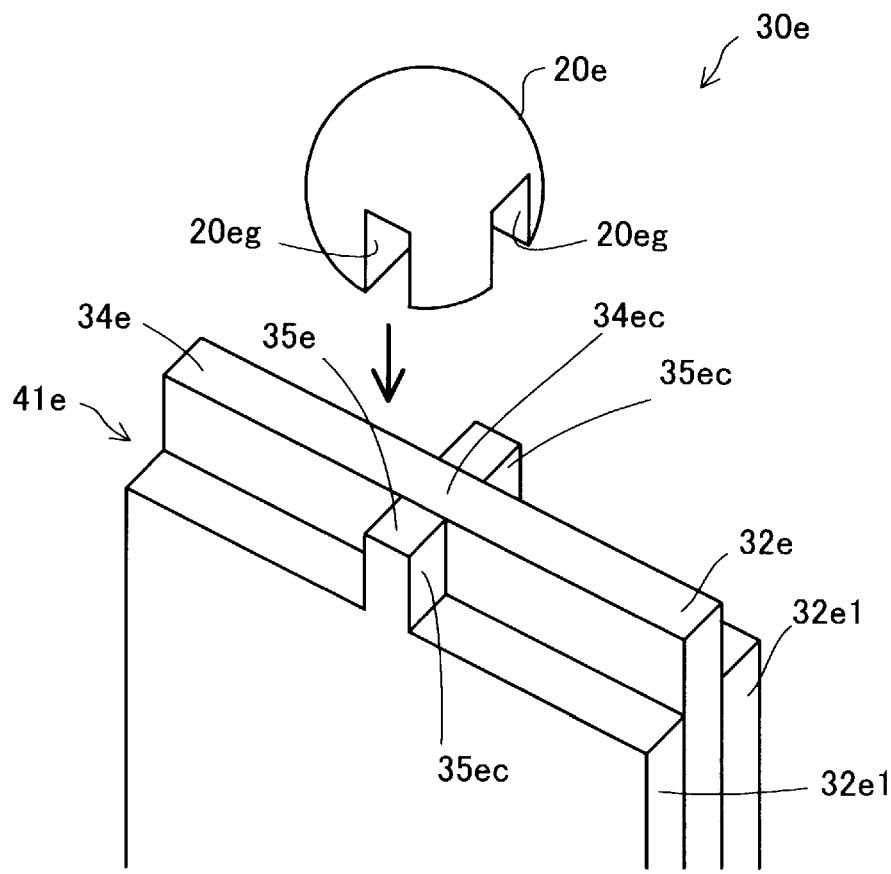
FIG. 20 is a perspective view of a piezoelectric drive device of a sixth embodiment.
Figure 21:
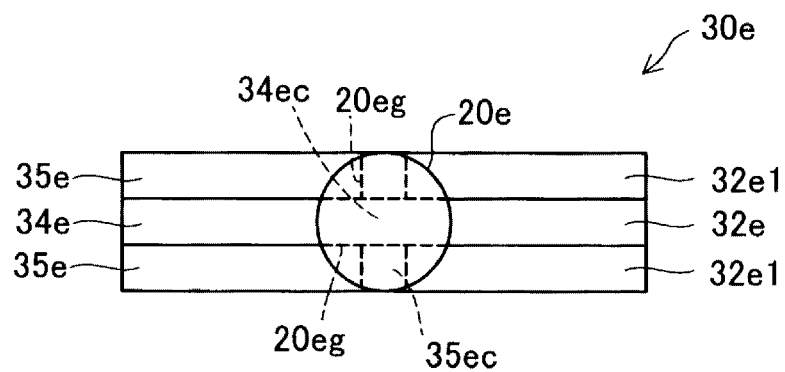
FIG. 21 shows the piezoelectric drive device of the sixth embodiment as seen in the direction of the arrow B.
Figure 22:
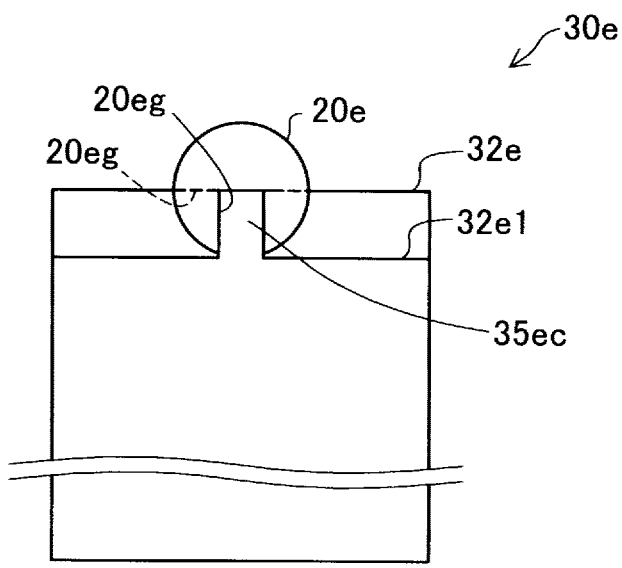
FIG. 22 shows the piezoelectric drive device of the sixth embodiment as seen in the direction of the arrow C.

FIG. 20 is a perspective view of a piezoelectric drive device 30e of a sixth embodiment. FIG. 21 shows the piezoelectric drive device 30e of the sixth embodiment as seen in the direction of the arrow B, i.e., from a projecting portion 20e side. FIG. 22 shows the piezoelectric drive device 30e of the sixth embodiment as seen in the direction of the arrow C, i.e., from a stacking direction of units 32e, 32e1.

In the piezoelectric drive device 30e of the sixth embodiment, no concave portion is provided in a short side 34e of a unit 32e at the center like the piezoelectric drive device 30c of the fourth embodiment. Further, the units 32e1 at the outsides in the stacking direction include concave portions 41e in parts except center portions 35ec of short sides 35e. According to the configuration, in the piezoelectric drive device 30e, a cross-shaped convex portion is formed by a center portion 34ec of the short side 34e of the center unit 32e and the center portions 35ec of the units 32e1 in the position in which the projecting portion 20e is placed. The projecting portion 20e includes a cross-shaped groove 20eg and the cross-shaped convex portion, i.e., the center portion 34ec of the unit 32e and the center portions 35ec of the units 32e1 are inserted into the groove 20eg.

According to the sixth embodiment, the center portion 34ec of the unit 32e and the center portions 35ec of the units 32e1 are inserted into the groove 20eg of the projecting portion 20e. As a result, even when a force in a direction along a plane formed by the unit 32e is applied to the projecting portion 20e, the center portions 35ec of the units 32e1 suppress dropping of the projecting portion 20e. Further, even when a force in the stacking direction of the units 32e, 32e1 is applied to the projecting portion 20e, the center portion 34ec may suppress dropping of the projecting portion 20e in a side-surface direction. Furthermore, the contact area between the groove 20eg of the projecting portion 20e and the center portions 34ec, 35ec is larger, and thus, the bonding force may be made stronger and dropping of the projecting portion 20e may be suppressed.

In the sixth embodiment, the units 32e1 at the outsides in the stacking direction may have the same configuration as those of the units 32d of the piezoelectric drive device 30d of the fifth embodiment. Even when a force in a direction along a plane formed by the units 32e, 32e1 is applied, dropping of the projecting portion 20e may be suppressed like the piezoelectric drive device 30d of the fifth embodiment.

G. Seventh Embodiment

Figure 23:
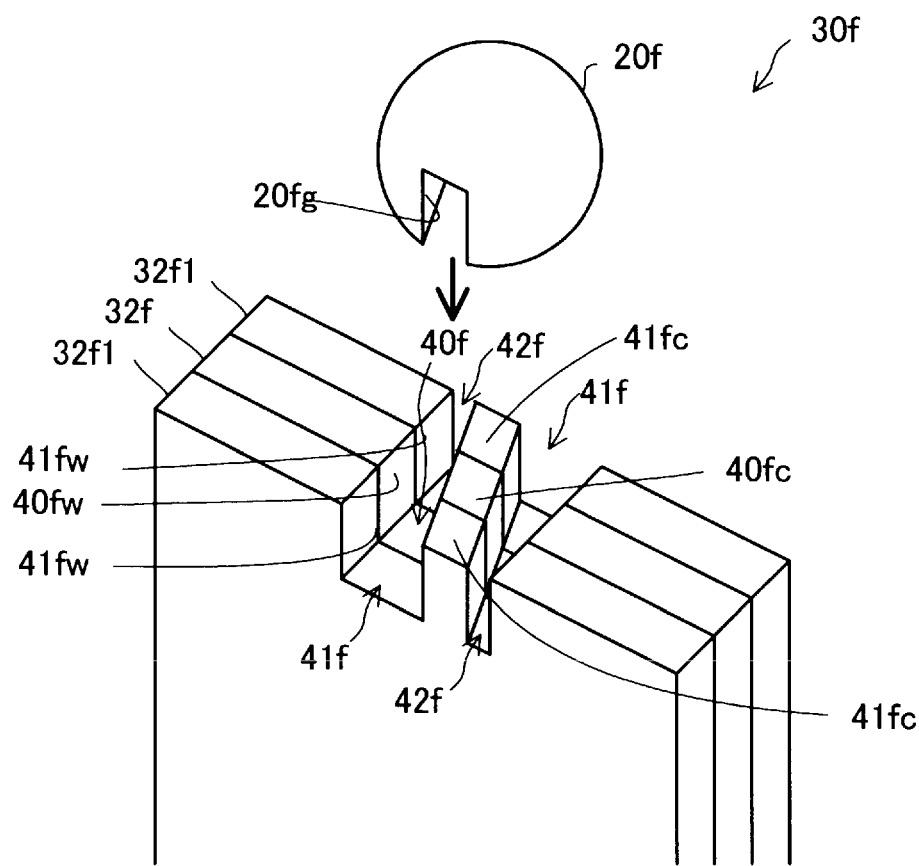
FIG. 23 is a perspective view of a piezoelectric drive device of a seventh embodiment.
Figure 24:
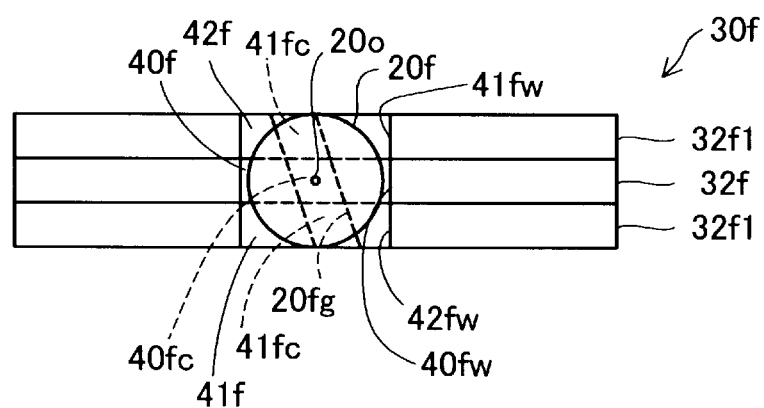
FIG. 24 shows the piezoelectric drive device of the seventh embodiment as seen in the direction of the arrow B.

FIG. 23 is a perspective view of a piezoelectric drive device 30f of a seventh embodiment. FIG. 24 shows the piezoelectric drive device 30f of the seventh embodiment as seen in the direction of the arrow B, i.e., from a projecting portion side. In the piezoelectric drive device 30d of the fifth embodiment, the side surfaces 40dw of the concave portions 40d and the convex portions 40dc formed in the concave portions 40d are perpendicular to the plane formed by the units 32d. On the other hand, the piezoelectric drive device 30f of the seventh embodiment is different in that angles formed by convex portions 40fc, 41fc and a plane formed by units 32f, 32f1 are not right angles. Note that the two units 32f1 are provided symmetrically with respect to a center axis 20o of a projecting portion 20f.

In the piezoelectric drive device 30f of the seventh embodiment, as is the case with the fifth embodiment, the convex portion 40fc of the unit 32f and the convex portions 41fc of the units 32f1 are inserted into a groove 20fg of the projecting portion 20f, and thus, even when a force in a direction along a plane formed by the units 32f, 32f1 is applied to the projecting portion 20f, dropping of the projecting portion 20f may be suppressed by side surfaces 40fw, 41fw, 42fw and the convex portions 40fc, 41fc. Further, the contact area between the groove 20fg of the projecting portion 20f and the convex portions 40fc, 41fc is larger, and thus, the bonding force may be made stronger and dropping of the projecting portion 20f may be suppressed.

In the piezoelectric drive device 30f of the seventh embodiment, the shapes of the convex portions 40fc, 41fc are diagonal, however, the positions of the convex portions 40fc, 41fc may be diagonally provided, that is, the convex portions may be provided in a stepwise fashion.

H. Eighth Embodiment

Figure 25:
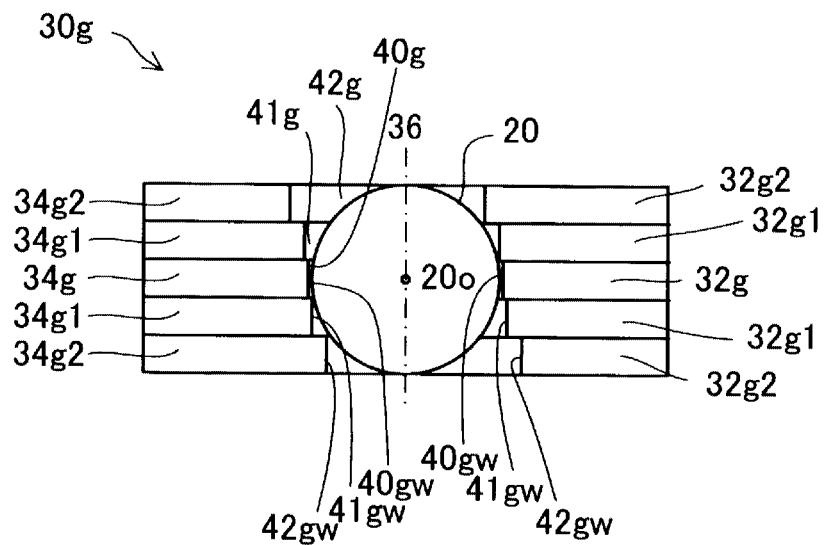
FIG. 25 shows a piezoelectric drive device of an eighth embodiment as seen in the direction of the arrow B.

A piezoelectric drive device 30g of an eighth embodiment is different from the piezoelectric drive device 30 of the first embodiment only in positions of concave portions 40g, 41g, 42g, and the rest of the configuration is the same. FIG. 25 shows the piezoelectric drive device 30g of the eighth embodiment as seen in the direction of the arrow B, i.e., from a projecting portion side. The concave portion 40g of the unit 32g at the center in the stacking direction is formed at the center of a short side 34g of the unit 32g. The concave portion 41g of the unit 32g1 at the outside in the stacking direction is formed with a slight shift from a center 36 of a short side 34g1 of the unit 32g1. Furthermore, the concave portion 42g of the unit 32g2 at the outer side in the stacking direction is formed with a larger shift from the center 36 of a short side 34g2 than the concave portion 41g of the unit 32g1. Note that a distance between two side surfaces 40gw of the concave portion 40g, a distance between two side surfaces 41gw of the concave portion 41g, and a distance between two side surfaces 42gw of the concave portion 42g are the same. The concave portions 40g, 41g, 42g are provided symmetrically with respect to a center axis 20o of the projecting portion 20.

According to the piezoelectric drive device 30g of the eighth embodiment, even when a force in a direction orthogonal to the side surfaces 40gw is applied to the projecting portion 20, the side surfaces 40gw suppress dropping of the projecting portion 20. Further, even when a force in the stacking direction of the units 32g, 32g1, 32g2 is applied to the projecting portion 20, one side surface 40gw of the two side surfaces 40gw may suppress dropping of the projecting portion 20.

I. Other Embodiment

In the above described embodiments, the cases where the number of units is three or five are explained as examples, however, the number of units may be equal to or larger than three e.g. four or six. When the number of units is an even number, four, two units may be placed at the center and the respective single units may be placed at the outsides. No concave portion may be formed in units on both ends in the stacking direction. Even when a force in the stacking direction is applied, the units on both ends in the stacking direction may suppress dropping of the projecting portion.

J. Another Embodiment

Figure 26:
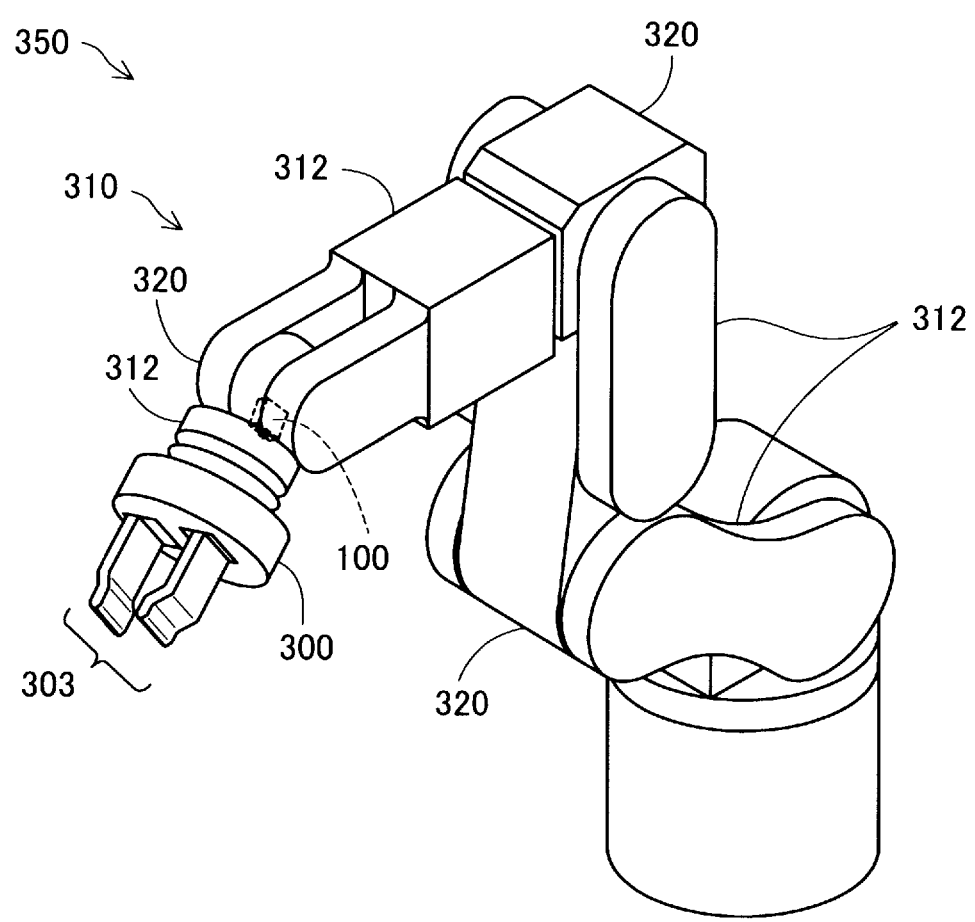
FIG. 26 is an explanatory diagram showing an example of a robot using the piezoelectric drive devices.

FIG. 26 is an explanatory diagram showing an example of a robot using the piezoelectric drive devices 30. A robot 350 has an arm 310 (also referred to as "arm unit") including a plurality of link parts 312 (also referred to as "link members") and a plurality of joint parts 320 pivotably or bendably coupling those link parts 312. Inside of the respective joint parts 320, the above described piezoelectric drive devices 30 are provided, and the joint parts 320 can be pivoted or bent by arbitrary angles using the piezoelectric drive devices 30. A robot hand 300 is coupled to the distal end of the arm 310. The robot hand 300 includes a pair of gripping parts 303. The piezoelectric drive device 30 is also provided in the robot hand 300, and the gripping parts 303 can be opened and closed to grip an object using the piezoelectric drive device 30. Further, the piezoelectric drive device 30 is also provided between the robot hand 300 and the arm 310, and the robot hand 300 can be rotated relative to the arm 310 using the piezoelectric drive device 30.

The present disclosure is not limited to the above described embodiments, but may be realized in various aspects without departing from the scope thereof. For example, the present disclosure can be realized in the following aspects. The technical features in the above described embodiments corresponding to the technical features in the following respective aspects can be appropriately replaced or combined for solving part or all of the challenges of the present disclosure or achieving part or all of the effects of the present disclosure. Further, when the technical features are not explained as essential features in this specification, the technical features can be appropriately deleted.

(1) According to one aspect of the present disclosure, a piezoelectric drive device is provided. The piezoelectric drive device includes a piezoelectric element, a vibrating plate with a concave portion provided in a side surface, and a projecting portion provided between two side surfaces of the concave portion and having a spherical shape, an elliptical shape, or an egg shape, wherein a plurality of the piezoelectric elements and a plurality of the vibrating plates are stacked, and the concave portion includes a bottom surface. According to the aspect, the piezoelectric drive device includes the projecting portion in the concave portion having the bottom surface and the two side surface facing each other, and thereby, dropping of the projecting portion may be suppressed.

(2) In the above described aspect, a distance between the two side surfaces at the bottom surface side may be larger than a distance between the two side surfaces at an opposite side to the bottom surface. According to the aspect, the projecting portion may be made harder to climb the side surface, and thereby, dropping of the projecting portion may be suppressed.

(3) In the above described aspect, a depth of the concave portion may be shallower than a length from a base end of the projecting portion to a top part at an opposite side to the base end and equal to or more than a half of the length from the base end to the top part. According to the aspect, a half or more of the projecting portion is inserted into the concave portion, and thereby, dropping of the projecting portion may be further suppressed.

(4) In the above described aspect, a depth of the concave portion may be equal to or less than a half of a length from a base end of the projecting portion to a top part at an opposite side to the base end. According to the aspect, an amount of projection of the projecting portion may be made larger.

(5) In the above described aspect, the concave portions may be provided in the plurality of vibrating plates, and a depth of the concave portion in the vibration plate placed at a center in a stacking direction of the plurality of vibrating plates may be deeper than a depth of the concave portion in the other vibration plate. According to the aspect, the depth of the vibrating plate in the stacking direction is shallower on both end sides in the stacking direction, and thereby, even when a force in the stacking direction is applied, the bottom surface suppresses dropping of the projecting portion.

(6) In the above described aspect, the concave portions may be provided in the plurality of vibrating plates, a convex portion being relatively convex may be provided between the two concave portions of the plurality of concave portions, and a recessed portion that fits with the convex portion may be provided in the projecting portion. According to the aspect, the contact area between the convex portion and the recessed shape of the projecting portion may be made larger, and thereby, dropping of the projecting portion may be suppressed.

(7) In the above described aspect, the plurality of concave portions may be arranged in the stacking direction. According to the aspect, dropping of the projecting portion in the stacking direction may be suppressed.

(8) In the above described aspect, the plurality of concave portions may be arranged in a direction crossing the stacking direction. According to the aspect, dropping of the projecting portion in the direction crossing the stacking direction may be suppressed.

The present disclosure can be realized in other various aspects than the piezoelectric drive device. For example, the present disclosure may be realized in aspects of an ultrasonic motor including a piezoelectric drive device and a driven member, a robot including a plurality of link parts, joint parts coupling the plurality of link parts, and piezoelectric drive devices pivoting the plurality of link parts by the joint parts, etc.

What is claimed is:

1. A piezoelectric drive device comprising:
   a plurality of piezoelectric elements;
   a plurality of vibrating plates, each vibrating plate with a concave portion provided in a side surface; and
   a projecting portion provided between two side surfaces of the concave portion and having a spherical shape or an elliptical shape or an egg shape, wherein
   the plurality of piezoelectric elements and the plurality of vibrating plates are stacked, and
   the concave portion includes a bottom surface,
   wherein a depth of the concave portion is shallower than a length from a base end of the projecting portion to a top part at an opposite side to the base end and equal to or more than a half of the length from the base end to the top part.

2. The piezoelectric drive device according to claim 1, wherein
   a distance between the two side surfaces at the bottom surface is larger than a distance between the two side surfaces at an opposite side to the bottom surface.

3. The piezoelectric drive device according to claim 1, wherein
   a plurality of concave portions are provided in the plurality of vibrating plates, and
   a depth of a concave portion in a vibration plate placed at a center in a stacking direction of the plurality of vibrating plates is deeper than a depth of a concave portion in an other vibration plate.

4. The piezoelectric drive device according to claim 3, wherein
   the plurality of concave portions are arranged in the stacking direction.

5. The piezoelectric drive device according to claim 3, wherein
   the plurality of concave portions are arranged in a direction crossing the stacking direction.

6. The piezoelectric drive device according to claim 1, wherein
   a plurality of concave portions are provided in the plurality of vibrating plates,
   a convex portion being relatively convex is provided between two concave portions of the plurality of concave portions, and
   a recessed portion that fits with the convex portion is provided in the projecting portion.

7. An ultrasonic motor comprising:
   the piezoelectric drive device according to claim 1; and
   a driven member driven by the piezoelectric drive device.

8. A robot comprising:
   a plurality of link parts;
   joint parts coupling the plurality of link parts; and
   the piezoelectric drive device according to claim 1 that pivots the plurality of link parts by the joint parts.

* * * * *